(12) United States Patent
Xu et al.

(10) Patent No.: US 8,050,048 B2
(45) Date of Patent: Nov. 1, 2011

(54) LEAD FRAME WITH SOLDER FLOW CONTROL

(75) Inventors: Xuesong Xu, Tianjin (CN); Meijiang Song, Tianjin (CN); Jinzhong Yao, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 891 days.

(21) Appl. No.: 12/053,622

(22) Filed: Mar. 24, 2008

(65) Prior Publication Data

US 2008/0266828 A1 Oct. 30, 2008

(30) Foreign Application Priority Data

Apr. 29, 2007 (CN) .......................... 2007 1 0101144

(51) Int. Cl.
*H02B 1/56* (2006.01)
*H01R 43/00* (2006.01)
*H01L 23/48* (2006.01)
*H01L 23/52* (2006.01)
*H05K 5/02* (2006.01)

(52) U.S. Cl. .......... 361/767; 29/827; 257/666; 257/779; 361/813

(58) Field of Classification Search .................. None
See application file for complete search history.

(56) References Cited

U.S. PATENT DOCUMENTS

| | | | | |
|---|---|---|---|---|
| 3,827,918 A | * | 8/1974 | Ameen et al. ................. | 428/601 |
| 5,384,155 A | * | 1/1995 | Abbott et al. ................. | 427/125 |
| 5,403,466 A | | 4/1995 | West et al. | |
| 5,804,880 A | * | 9/1998 | Mathew ........................ | 257/779 |
| 6,139,975 A | * | 10/2000 | Mawatari et al. ............. | 428/600 |
| 6,684,496 B2 | * | 2/2004 | Glenn ............................ | 29/841 |
| 7,042,103 B2 | * | 5/2006 | Condie et al. ................. | 257/782 |
| 2002/0029473 A1 | | 3/2002 | Kwoka | |
| 2003/0234444 A1 | * | 12/2003 | Smith et al. ................... | 257/690 |

FOREIGN PATENT DOCUMENTS

JP 2004-119944 4/2004

* cited by examiner

*Primary Examiner* — Gregory Thompson
(74) *Attorney, Agent, or Firm* — Charles Bergere

(57) ABSTRACT

A lead frame has multiple regions having different wetting characteristics on its surface. For example, one region is formed to handle silver plating while another has less wetting ability. A boundary between the regions causes a wetting force difference that inhibits molten solder flow between regions during solder die bonding.

12 Claims, 1 Drawing Sheet

LEAD FRAME WITH SOLDER FLOW CONTROL

BACKGROUND OF THE INVENTION

The present invention relates to semiconductor devices, and more particularly to treating a die receiving area of a lead frame to prevent solder over flow during solder die bonding.

Lead frames often have a die pad to which an integrated circuit die is attached. For high power devices, solder is usually used to attach the die to the die pad because of its good thermal/electrical conductivity and ability to absorb stresses due to coefficient of thermal expansion (CTE) mismatches. The solder joint between the lead frame and the silicon die provides a high thermal dissipation of the heat released by the silicon die and a strong resistance of the thermal fatigue.

Lead frames are formed of a conductive metal such as copper or a copper alloy. It is also common to plate the lead frame such as with Silver or Palladium to improve die attach quality, and it is further known to spot plate areas of the lead frame like the lead frame fingers and the die pad, in order to improve the die attach quality.

Solder over flow is a common problem encountered in solder die bonding. One method of preventing solder over flow is with a moat formed between the die receiving area and the surrounding area. FIG. 1 is a top plan view of a die receiving area 10 of a lead frame having a die 12 attached to a surface thereof. A moat 14 surrounds the die 12. Unfortunately, the moat 14 does not always prevent solder from flowing from below the die 12 and into the surrounding die receiving area. Solder over flow 16 is shown in FIG. 1. The moat design is limited by the ratio of die size to die pad size. Such over-flow solder 16 induces stress on the package and weakens the adhesion between the lead frame and a plastic compound that is molded over the die later in the packaging process.

The wetting ability of molten solder with the lead frame surface influences the flow of solder during die bonding. Conventional lead frames used for solder die bonding have uniform surfaces. That is, all parts of the die pad have the same wetting ability with solder, thus the molten solder flows freely around the die pad when bond pressure is applied.

Accordingly, an object of the present invention is to provide a lead frame with improved solder over flow control and a method for forming the lead frame.

BRIEF DESCRIPTION OF THE DRAWINGS

The following detailed description of the preferred embodiments of the invention will be better understood when read in conjunction with the appended drawings. In the drawings.

DETAILED DESCRIPTION OF THE INVENTION

The detailed description set forth below in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention. The present invention is illustrated by way of example and is not limited by the accompanying figures, in which like references indicate similar elements. It is to be understood that the drawings are not to scale and have been simplified for ease of understanding the invention.

The present invention provides, in one embodiment, a lead frame having a plurality of regions with different wetting ability on the die pad surface. The die attach area of the die pad has a greater wetting ability than the surrounding area. The lead frame undergoes a surface treatment to form the various regions. Surface treatment of either the die receiving area of the surrounding area includes chemical treatment such as chemical plating, electrical plating, acid washing, carbonization, nitriding, chemical vapor deposition, or chemical etching, and/or physical treatment such as laser surface modification, plasma etching, or laser etching.

A lead frame in accordance with an embodiment of the present invention may also include a moat on the die pad to prevent solder over flow.

A boundary formed between a region have a good wetting ability and a region of lesser wetting ability causes a wetting force difference, which arrests molten solder flow out during die bonding. Other objects, features and advantages of the present invention will be apparent from the following description when taken in conjunction with the accompanying drawings.

Figure 1:
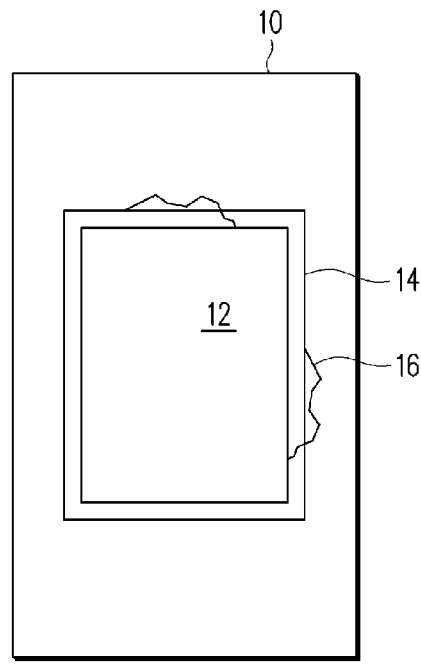
FIG. 1 is a top plan view of a conventional lead frame die pad in which there is solder over flow.
Figure 2:
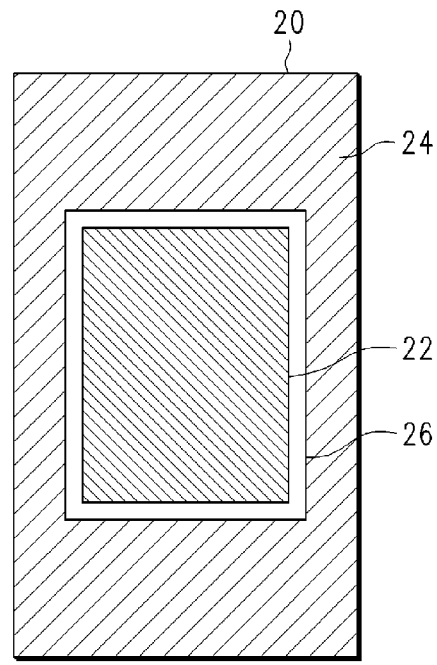
FIG. 2 is a top plan view of a die pad of a lead frame in accordance with one embodiment of the present invention.

Referring now to FIG. 2, a die pad 20 of a lead frame is shown. The lead frame is of a well known type, such as a copper or copper alloy metal frame. The metal lead frame may be plated with another metal such as tin or palladium, as known by those of skill in the art. In the embodiment shown, the die pad 20 has two regions with different soldering ability, including a first region 22 for receiving a semiconductor die and a second region 24 surrounding the first region 22. Either the first or second or both regions are treated to form regions with different wetting characteristics. The first region 22 has a better wetting ability with molten solder than the second region 24 so that when a die is attached to the first region with solder, the solder will remain in the first region 22 and not flow into the second region 24.

The die pad 20 may have a moat 26 disposed between the first and second regions 22 and 24. The moat 26 acts as a barrier to assist in the prevention of solder over flow during die attach.

Figure 3:
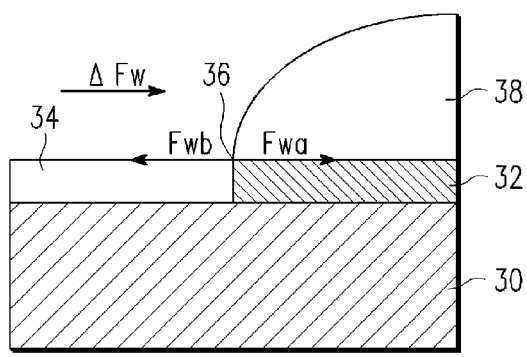
FIG. 3 is an enlarged cross-sectional view of a lead frame die pad in accordance with one embodiment of the present invention.

Referring now to FIG. 3, a cross-sectional view of a die pad 30 of a lead frame is shown. The die pad 30 has a first region 32 for receiving a die and a second region 34 surrounding the first region 32. At least one of the first and second regions 32 and 34 is treated, either physically or chemically, so that the first region 32 has a better wetting ability than the second region 34. A boundary 36 delineating the two regions is formed between the two regions 32 and 34.

In FIG. 3, $F_{Wa}$ illustrates the wetting power of the first region 32 with solder and $F_{Wb}$ illustrates the wetting power of the second region 34 with the solder. According to the present invention, $\Delta Fw = F_{wa} - F_{wb}$, where $F_{Wa} \gg F_{Wb}$, so that the wetting power along the boundary 36 tends to prevent the flow of molten solder from the first region 32 beyond the boundary 36 and into the second region 34. Molten solder 38 is shown on the first region 32. However, due to the differences in wetting abilities between the first and second regions 32 and 34, the molten solder 38 tends not to flow from the first region 32 into the second region 34.

Figure 4:
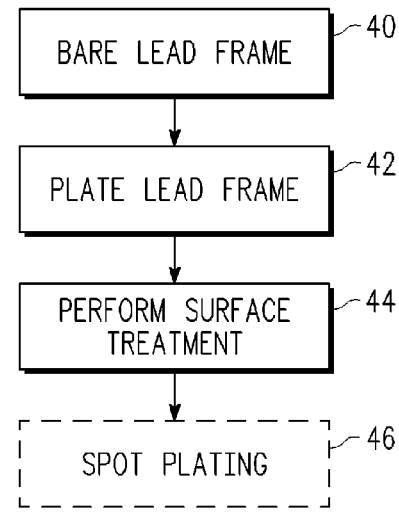
FIG. 4 is a flow chart illustrating the steps in fabricating a lead frame in accordance with an embodiment of the present invention.

Referring now to FIG. 4, a flow chart illustrating a process of forming a lead frame in accordance with an embodiment of the present invention is shown. At step 40, a bare metal lead frame is provided. The lead frame may comprise copper or a copper alloy and be formed from a metal sheet by punching, stamping or etching, as is known in the art. At step 42, the bare metal lead frame is plated, such as with silver, tin, palladium, or alloys thereof. Plating of lead frames is known and indeed, pre-plated lead frames are widely commercially available.

At step 44, regions are defined for a top and/or bottom surface of the lead frame. In one embodiment of the invention, first and second regions are defined for a die pad of the lead frame. For example, a first region is defined as the die receiving area and a second region is the area surrounding the die receiving area. Either one or both (or multiple if multiple regions are defined) of the regions are treated to define areas having different wetting characteristics. An optional spot plating process may be performed, as indicated at step 46, to further change the wetting characteristics of one or both of the regions. One particular reason for defining regions of different wetting characteristics is to prevent solder from flowing from the die attach region into the surrounding region during a solder die attach process.

At step 44, the surface treatments that can be used to change the wetting characteristics of the regions include both chemical and physical treatments. Chemical treatments that may be performed are chemical plating, electrical plating, acid washing, carbonization, nitriding, vapor deposition, and chemical etching, while the physical treatments include laser surface modification, plasma etching.

For example, various methods of etching the surface of the lead frame may be performed, such as chemical etching, laser etching and plasma etching. Each of the etching processes discussed here are micro etching processes for surface micromorphology change, which will induce a surface roughness change. Different surface roughness can result in different wetting characteristics in desired regions, for example, a region slightly larger than the die area.

In addition to or in lieu of etching the surface of the lead frame, the surface of the lead frame can be plated. Various plating methods may be used such as chemical plating and electrical plating. In addition, the surface of the lead frame may be treated such as with acid washing and chemical vapor deposition. Acid washing is used to form a passivation layer on the metal surface that results in a different wetting characteristic in the desired regions. Chemical vapor deposition is used to deposit different materials on a desired region to form different wetting characteristics.

In one embodiment of the invention in which the lead frame includes metal plating, the die pad includes an additional metal plating layer formed over the first region 22. In one embodiment, the additional metal plating layer comprises a solder metal, such as a composition of about 92.5% Pb, about 5% Sn, and about 2.5% Ag. Such additional metal plating layer may be formed on the surface via the aforementioned methods of electrical or chemical plating or vapor deposition.

Carburization, also referred to as carburizing, is a process in which carbon is introduced into a metal. In one embodiment of the present invention, carbon is diffused into the surface of the first region, which makes the surface harder and more abrasion resistant. As is known by those of skill in the art, carburization involves a heat treatment of the metal surface using a gaseous, liquid, solid or plasma source of carbon.

Nitriding is a surface-hardening heat treatment that introduces nitrogen into the surface of the metal at a temperature range of about 500 to 550° C. Thus, nitriding is similar to carburizing in that surface composition is altered, but different in that nitrogen is added into the metal instead of austenite. Because nitriding does not involve heating into the austenite phase field and a subsequent quench to form martensite, nitriding can be accomplished with a minimum of distortion and with excellent dimensional control. Mechanisms of nitriding are generally known.

Laser Surface Modification also may be used to alter the surface of the die pad to change the surface properties. The primary laser-based surface modification operations are laser cladding and laser surface alloying. Through the laser cladding process, a wide range of materials can be clad on the desired region to achieve different wetting characteristics. Laser surface alloying is used to add desired alloy elements to alter the surface composition as best suited for various requirements. Such different wetting characteristics can be achieved by cladding a different material or by adding a different alloy element to the desired surface.

The above described lead frame according to the present invention is especially useful for power integrated circuits such as power transistors and RF devices. The present invention is also beneficial for solder wire die attach processes. It should be noted that although FIGS. 2 and 3 only show two distinct regions, multiple patterns with optional wetting ability regions can be formed on the lead frame surface.

As is evident from the foregoing discussion, the present invention provides an improved lead frame with different soldering ability regions on the die pad surface and a method for forming such lead frame. Advantageously, the desired soldering region is handled with better ability with solder such as silver plating, while another region has less wetting ability, the boundary between good wetting region and lesser wetting region will cause a wetting force difference, which will arrest molten solder flow out during dispensing and bonding.

The present invention is not limited by the die size and pad size. The desired soldering area size can be designed just a little larger than the die size, compared to the prior art method of using a moat.

The description of the preferred embodiments of the present invention have been presented for purpose of illustration and description, but are not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiments disclosed here, but covers modifications within the spirit and scope of the present invention as defined by the appended claims.

The invention claimed is:
1. A die pad for a lead frame, comprising:
a first region for receiving a die; and
a second region surrounding the first region, wherein at least one of the first and second regions is treated so that the first and second regions have different wetting ability such that when the die is attached to the first region with solder, the solder is inhibited from spreading from the first region into the second region, and wherein said treating comprises one of carburization and nitriding.
2. The die pad of claim 1, wherein the first region is treated by one of chemical etching, plasma etching and laser etching.

3. The die pad of claim 1, wherein the lead frame includes metal plating, the die pad further comprising an additional metal plating layer formed over the first region.

4. The die pad of claim 3, wherein the additional metal plating layer comprises a solder metal.

5. The die pad of claim 4, wherein the solder metal comprises about 92.5% Pb, about 5% Sn, and about 2.5% Ag.

6. The die pad of claim 1, further comprising a moat formed between the first and second regions.

7. A method of forming a lead frame, comprising the steps of:
providing a metal die pad having a first region for receiving a die and a second region surrounding the first region;
treating one of the first and second regions so that the first region has a greater wetting ability than the second region so that when a die is attached to the first region with solder, the solder is inhibited from spreading from the first region into the second region, and wherein said treating comprises one of carburization and nitriding.

8. The method of forming a lead frame of claim 7, further comprising the step of forming a moat between the first and second regions.

9. The method of forming a lead frame of claim 7, wherein the first region is treated by one of chemical etching, plasma etching, and laser etching.

10. The method of forming a lead frame of claim 7, further comprising the step of plating the first region.

11. The method of forming a lead frame of claim 10, wherein the plating added to the first region comprises a solder metal.

12. The method of forming a lead frame of claim 11, wherein the solder metal comprises about 92.5% Pb, about 5% Sn, and about 2.5% Ag.

* * * * *